(12) United States Patent
Chen et al.

(10) Patent No.: US 12,512,376 B2
(45) Date of Patent: Dec. 30, 2025

(54) SEMICONDUCTOR STRUCTURE AND METHOD OF FORMING

(71) Applicant: TAIWAN SEMICONDUCTOR MANUFACTURING COMPANY LTD., Hsinchu (TW)

(72) Inventors: Hsien-Wei Chen, Hsinchu (TW); Ching-Jung Yang, Taoyuan County (TW); Ming-Fa Chen, Taichung (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 17/857,993

(22) Filed: Jul. 5, 2022

(65) Prior Publication Data
US 2022/0336303 A1    Oct. 20, 2022

Related U.S. Application Data

(62) Division of application No. 15/895,358, filed on Feb. 13, 2018, now Pat. No. 11,562,935.

(Continued)

(51) Int. Cl.
*H01L 23/13* (2006.01)
*H01L 23/00* (2006.01)
(Continued)

(52) U.S. Cl.
CPC ............ *H01L 23/13* (2013.01); *H01L 23/293* (2013.01); *H01L 23/3121* (2013.01); *H01L 23/5389* (2013.01); *H01L 24/13* (2013.01); *H01L 24/24* (2013.01); *H01L 24/32* (2013.01); *H01L 24/73* (2013.01); *H01L 25/0652* (2013.01); *H01L 23/147* (2013.01); *H01L 23/15* (2013.01); *H01L 23/3128* (2013.01); *H01L 23/36* (2013.01); *H01L 2224/13024* (2013.01); *H01L 2224/13025* (2013.01); *H01L 2224/24137* (2013.01);
(Continued)

(58) Field of Classification Search
CPC ... H01L 23/13; H01L 23/293; H01L 23/3121; H01L 23/5389; H01L 24/13; H01L 24/24; H01L 24/32; H01L 24/73; H01L 23/147; H01L 23/15; H01L 2224/13024; H01L 2224/13025
See application file for complete search history.

(56) References Cited

U.S. PATENT DOCUMENTS

| | | | |
|---|---|---|---|
| 9,728,453 B2* | 8/2017 | Tseng | H01L 21/76895 |
| 2013/0168854 A1* | 7/2013 | Karikalan | H01L 24/73 257/784 |
| 2015/0371951 A1* | 12/2015 | Yeh | H01L 25/0655 257/774 |

* cited by examiner

Primary Examiner — Syed I Gheyas
(74) Attorney, Agent, or Firm — WPAT LAW; Anthony King

(57) ABSTRACT

A method of forming a semiconductor package device includes: providing a substrate; bonding a first die to an upper surface of the substrate through a bonding layer; bonding a second die to the upper surface of the substrate through the bonding layer, the second die laterally separated from the first die; depositing an insulation material between the first die and the second die and filling a gap measured between sidewalk of the first die and the second die; forming a first interconnect layer over the first die and the second die to form the semiconductor package device; and performing a testing operation on semiconductor package device with the substrate in place. A Young's modulus of the substrate is greater than that of the insulation material.

20 Claims, 7 Drawing Sheets

Related U.S. Application Data

(60) Provisional application No. 62/582,592, filed on Nov. 7, 2017.

(51) Int. Cl.
  *H01L 23/29* (2006.01)
  *H01L 23/31* (2006.01)
  *H01L 23/538* (2006.01)
  *H01L 25/065* (2023.01)
  *H01L 23/14* (2006.01)
  *H01L 23/15* (2006.01)
  *H01L 23/36* (2006.01)

(52) U.S. Cl.
  CPC ............... *H01L 2224/24146* (2013.01); *H01L 2224/24265* (2013.01); *H01L 2224/29188* (2013.01); *H01L 2224/32225* (2013.01); *H01L 2224/73209* (2013.01); *H01L 2224/73267* (2013.01); *H01L 2924/10161* (2013.01); *H01L 2924/182* (2013.01)

SEMICONDUCTOR STRUCTURE AND METHOD OF FORMING

PRIORITY CLAIM AND CROSS-REFERENCE

This application is a divisional application and claims the benefit of U.S. provisional application Ser. No. 62/582,592 filed on Nov. 7, 2017 and U.S. non-provisional application Ser. No. 15/895,358 filed Feb. 13, 2018, the disclosures of which are hereby incorporated by reference in its entirety.

BACKGROUND

Electronic equipment using semiconductor structures is essential for many modern applications. With the advancement of electronic technology, the semiconductor structures are becoming steadily compact while having greater functionality and greater amounts of integrated circuitry. With the increasing functionality and compact scale of the semiconductor structure, numerous manufacturing operations are implemented with increased complexity.

The manufacturing operations of the semiconductor structure involve many steps and operations on a compact and thin semiconductor structure. The manufacturing of the semiconductor structure in a miniaturized scale is becoming increasingly complicated. An increase in complexity of manufacturing the semiconductor structure may result in deficiencies such as poor electrical interconnection, delamination of components, or other issues, resulting in a high yield loss of the semiconductor structure and increase of manufacturing cost. As such, there are many challenges for modifying a structure of the semiconductor structures and improving the manufacturing operations.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION OF THE DISCLOSURE

Figure 1:
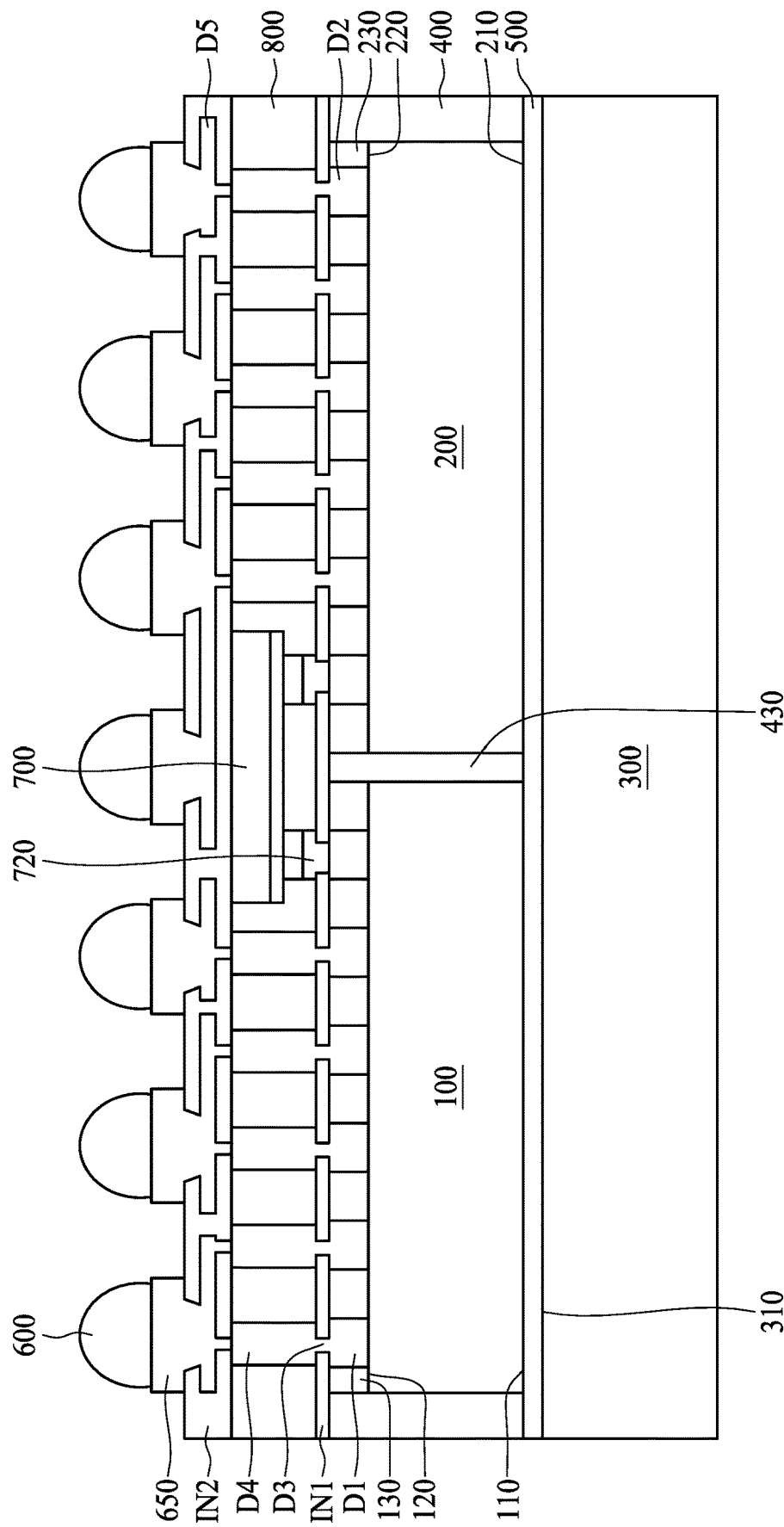
FIG. 1 is a cross-sectional view of a semiconductor structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In this document, the term "coupled" may also be termed as "electrically coupled," and the term "connected" may be termed as "electrically connected." "Coupled" and "connected" may also be used to indicate that two or more elements cooperate or interact with each other.

Other features and processes may also be included. For example, testing structures may be included to aid in the verification testing of 3D packaging or 3DIC devices. The testing structures may include, for example, test pads formed in a redistribution layer or on a substrate that allows the testing of the 3D packaging or 3DIC device, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

With the advancement of electronic technology, semiconductor or package structures are becoming steadily compact while having greater functionality and greater amounts of integrated circuitry. A compact semiconductor structure requires the dies inside the structure to be thin. However, thin dies may lead to warpage issue, for example, where each die or a combination of several dies is asymmetrical or not in a square shape when viewed from a top view perspective. The issue may be a warpage occurring during various processes of the manufacturing of the semiconductor structure, or may remain as an inherent residual stress within the semiconductor structure that might result in a warpage during subsequent processing, such as a reliability testing process or a mounting process of the semiconductor structure on another structure.

The warpage issue may further lead to poor electrical connection or failure of the semiconductor structure. For example, the warpage may result in a crack between two dies that further results in failure of other elements such as another electronic device or an interconnect structure, especially when the material between the dies has less stiffness or a lower Young's modulus compared to that of the dies. In another example, the warpage may cause a poor joint problem, such as cold joint, when the semiconductor structure is mounted on a substrate by, for example, controlled collapse chip connection (C4) bumps.

In some embodiments of the present disclosure, a semiconductor structure is disclosed. The semiconductor structure includes a substrate, a first die vertically over the substrate, a second die vertically over the substrate and laterally separated from the first die, and an insulation material between the first die and the second die. The substrate is at least partially overlapped with the insulation material from a top view perspective, and a Young's modulus of the substrate is higher than that of the insulation material. In some embodiments, by arranging the substrate under the dies and overlapped with the gap, the substrate can support the combination of the dies and reduce the possibility of warpage occurring in the structure. A substrate having a square shape from a top view perspective may have better performance regarding preventing warpage.

FIGS. 1 to 4 are examples of cross-sectional views of a semiconductor structure 1 in accordance with some embodiments of the present disclosure. The semiconductor structure 1 includes a substrate 300, a first die 100, a second die 200, a bonding layer 500, a first insulation material 400, a second insulation material 800, an electronic device 700, a first interconnect layer IN1, a second interconnect layer IN2 and several conductive bumps 600. In some embodiments, the semiconductor structure 1 is a semiconductor package. In some embodiments, the semiconductor structure 1 is a multi-dimensional package such as a 3-dimensional package. In some embodiments, the semiconductor structure 1 is a part of an integrated fan-out (InFO) package. In some embodiments, the semiconductor structure 1 is a part of a chip on wafer (CoW) structure or a chip on wafer on substrate (CoWoS) structure.

In some embodiments, the substrate 300 comprises silicon. In some embodiments, the substrate 300 has a stiffness greater than that of the first insulation material 400. In some embodiments, the substrate 300 has a higher Young's modulus than that of the first insulation material 400. In some embodiments, the substrate 300 has a Young's modulus between about 100 GPa and about 200 GPa. In some embodiments, the substrate 300 has a Young's modulus between about 130 GPa and about 185 GPa. In some embodiments, the substrate 300 has a coefficient of thermal expansion (CTE) lower than that of the first insulation material 400. In some embodiments, the substrate 300 has a CTE of about $3 \times 10^{-6}/°$ C. In some embodiments, the substrate 300 is a hulk silicon. In some embodiments, the substrate 300 is symmetrical when viewed from a top view perspective. In some embodiments, the substrate 300 has a rectangular shape, such as square, when viewed from a top view perspective. In some embodiments, the substrate 300 has an oval or circular shape when viewed from a top view perspective. In some embodiments, the substrate 300 comprises glass. In some embodiments, the substrate 300 is configured to support the semiconductor structure 1 in order to reduce warpage. In some embodiments, the substrate 300 is configured to improve thermal dissipation for the semiconductor structure 1. In some embodiments, a substrate 300 having a symmetrical shape when viewed from a top view perspective can provide better support to the semiconductor structure 1 and reduce warpage. In some embodiments, a substrate 300 having a square or circular shape when viewed from a top view perspective can provide even better support to the semiconductor structure 1 and reduce warpage.

Figure 4:
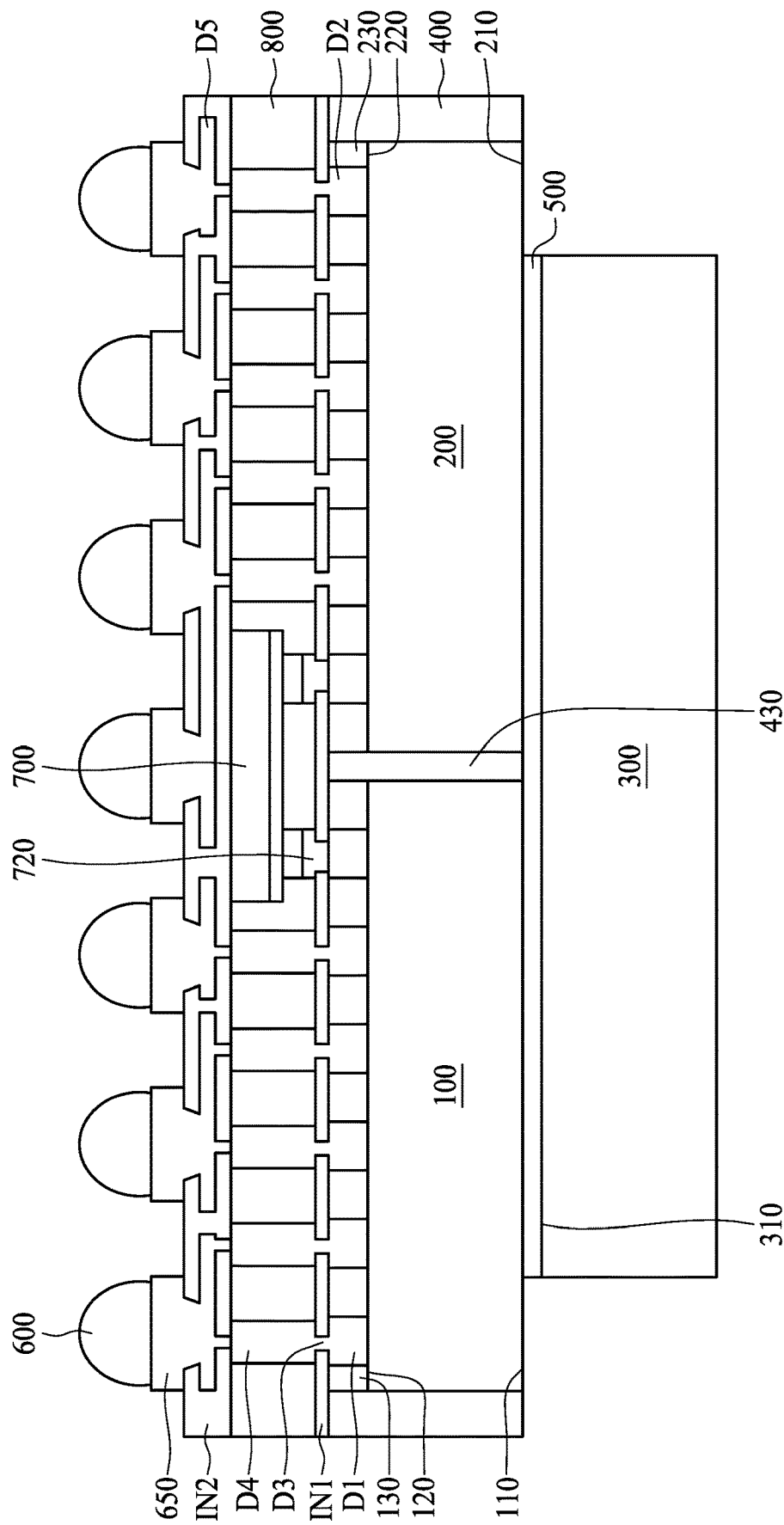
FIG. 4 is a cross-sectional view of a semiconductor structure in accordance with some embodiments of the present disclosure.

As shown in FIG. 1, in some embodiments, the first die 100 is disposed vertically over the substrate 300. In some embodiments, the first die 100 is disposed on the substrate 300. In some embodiments, a portion of the first die 100 is above the substrate 300, while another portion of the first die extends laterally beyond an edge of the substrate 300 such that the another portion of the first die does not overlap the substrate 300 when viewed from a top view perspective, as shown in FIG. 4. In some embodiments, the first die 100 comprises semiconductive materials such as silicon, and the first die 100 is fabricated with a predetermined functional circuit included within the first die 100, wherein the predetermined functional circuit is produced by operations such as photolithography, etching, deposition, etc. In some embodiments, the first die 100 is singulated from a silicon wafer by a mechanical blade or a laser blade. In some embodiments, the first die 100 is a chip, a device or the like. In some embodiments, the first die 100 comprises a variety of electrical circuits suitable for a particular application. In some embodiments, the electrical circuits include various devices such as transistors, capacitors, resistors, diodes and/or the like. In some embodiments, the first die 100 has a top-view cross section (i.e., a cross section of the semiconductor structure 1 as viewed from a top view perspective) having a quadrilateral, a rectangular or a square shape.

In some embodiments, the second die 200 is disposed vertically over the substrate and laterally separated from the first die 100. In some embodiments, the second die 200 is laterally separated from the first die 100 with a gap 430. In some embodiments, the substrate 300 is at least partially overlapped with the gap 430 when viewed from a top view perspective. In some embodiments, the gap 430, a portion of the first die 100 and a portion of the second die 200 are overlapped with the substrate 300 when viewed from a top view perspective, wherein the portion of the first die 100 and the portion of the second die 200 are next to the gap 430. In some embodiments, the second die 200 is disposed on the substrate 300. In some embodiments, a portion of the second die 200 is above the substrate 300, while another portion of the second die extends laterally beyond an edge of the substrate 300, such that the another portion of the second die does not overlap the substrate 300 when viewed from a top view perspective, as shown in FIG. 4. In some embodiments, the second die 200 comprises semiconductive materials such as silicon, and the second die 200 is fabricated with a predetermined functional circuit included within the second die 200, wherein the predetermined functional circuit is produced by operations such as photolithography, etching, deposition, etc. In some embodiments, the second die 200 is singulated from a silicon wafer by a mechanical blade or a laser blade. In some embodiments, the second die 200 is a chip, a device or the like. In some embodiments, the second die 200 comprises a variety of electrical circuits suitable for a particular application. In some embodiments, the electrical circuits include various devices such as transistors, capacitors, resistors, diodes and/or the like. In some embodiments, the second die 200 has a top-view cross section (i.e., a cross section of the semiconductor structure 1 from a top view perspective) having a quadrilateral, a rectangular or a square shape. In some embodiments, the substrate 300 is configured to support the first die 100 and/or the second die 200, in order to prevent warpage from occurring to the first die 100 and/or the second die 200, thus preventing a crack from occurring in, for example, the first die 100, the second die 200 or the gap 430. In some embodiments, a crack might occur within the semiconductor structure 1 due to warpage resulting from various processes, such as a reliability test process.

In some embodiments, a first dielectric 130 is disposed on a side of the first die 100. The side of the first die 100 faces away from the substrate 300. In some embodiments, several conductors D1 are disposed in the first dielectric 130. In some embodiments, the conductors D1 are electrically connected to the first die 100. In some embodiments, the conductors D1 are exposed through a side of the first dielectric 130. The side of the first dielectric 130 faces away from the first die 100. In some embodiments, the conductor D1 has a cylindrical shape. In some embodiments, the conductor D1 is a Cu via.

In some embodiments, a second dielectric 230 is disposed on a side of the second die 200. The side of the second die 200 faces away from the substrate 300. In some embodiments, several conductors D2 are disposed in the second dielectric 230. In some embodiments, the conductors D2 are electrically connected to the second die 200. In some embodiments, the conductors D2 are exposed through a side of the second dielectric 230. The side of the second dielectric 230 faces away from the second die 200. In some embodiments, the conductor D2 has a cylindrical shape. In some embodiments, the conductor D2 is a Cu via.

In some embodiments, the bonding layer 500 is between the first die 100 and the substrate 300, and between the second die 200 and the substrate 300. In some embodiments, the bonding layer 500 is in contact with the first die 100, the second die 200 and the substrate 300. In some embodiments, the bonding layer 500 fully covers a surface 310 of the substrate 300. The surface 310 faces the first die 100 and the second die 200. In some embodiments, the bonding layer 500 exposes a portion of the surface 310 that is not overlapped with the first die 100 or the second die 200 when viewed from a top view perspective. In some embodiments, the bonding layer 500 exposes a portion of the first die 100 or the second die 200 that is not overlapped with the substrate 300 when viewed from a top view perspective, as shown in FIG. 4. In some embodiments, a portion of the bonding layer 500 is extended laterally beyond an edge of the first die 100 or beyond an edge of the second die 200, and not overlapped with the first die 100 or the second die 200 from a top view perspective. In some embodiments, a sidewall or a portion of the bonding layer 500 is laterally exposed between the first insulation material 400 and the substrate 300. In some embodiments, the bonding layer 500 comprises oxide such as silicon oxide. In some embodiments, the bonding layer 500 comprises a die attach film. In some embodiments, the bonding layer 500 comprises metal. In some embodiments, a thickness of the bonding layer 500 is between about 0.1 μm and about 0.2 μm.

Figure 2:
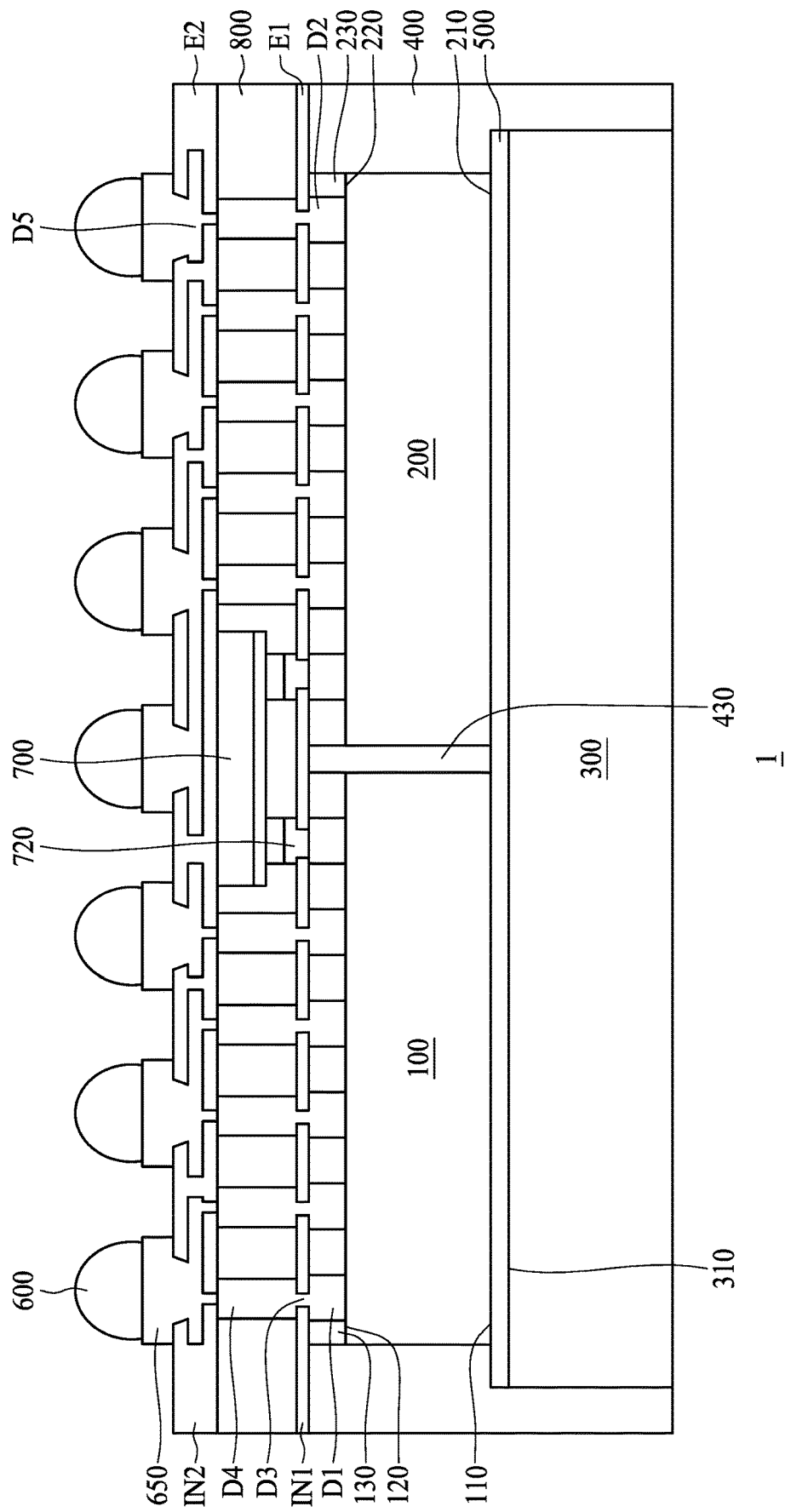
FIG. 2 is a cross-sectional view of a semiconductor structure in accordance with some embodiments of the present disclosure.
Figure 3:
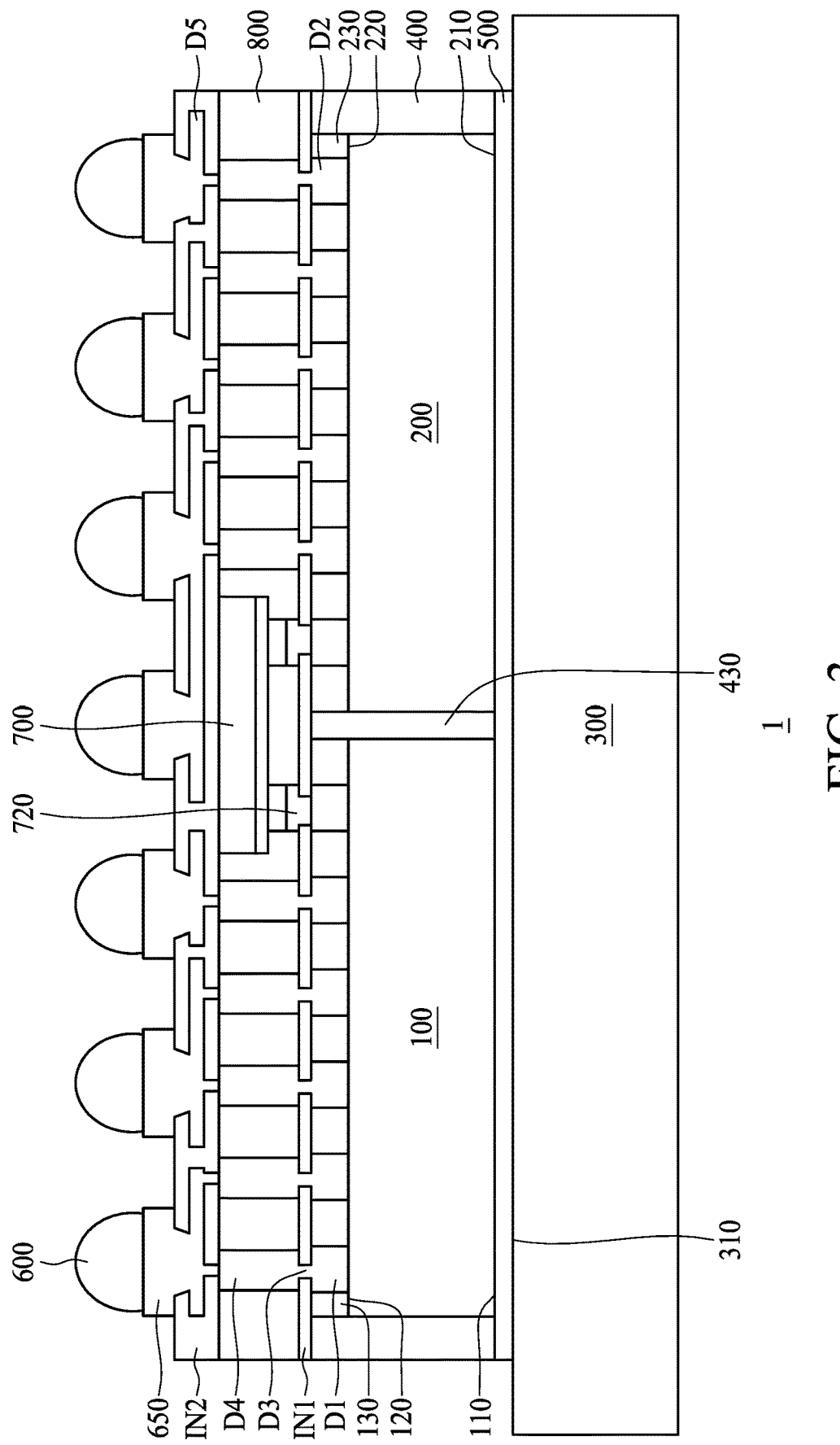
FIG. 3 is a cross-sectional view of a semiconductor structure in accordance with some embodiments of the present disclosure.

In some embodiments, the first insulation material 400 is disposed over the substrate 300. In some embodiments, the first insulation material 400 is disposed on the substrate 300. In some embodiments, the first insulation material 400 is disposed on the bonding layer 500. In some embodiments, the first insulation material 400 is disposed between the first die 100 and the second die 200, and is at least partially overlapped with the substrate 300 front a top view perspective. In some embodiments, the first insulation material 400 fills the gap 430 between the first die 100 and the second die 200. In some embodiments, the first insulation material 400 surrounds the first die 100 and/or the second die 200. In some embodiments, the first insulation material 400 surrounds the first dielectric 130 and/or the second dielectric 230. In some embodiments, the first insulation material 400 surrounds the substrate 300, as shown in FIG. 2, In some embodiments, the first die 100, the second die 200 or the substrate 300 is sealed or embedded in the first insulation material 400. In some embodiments, a portion of the substrate 300 is extended laterally beyond the edge of the first insulation material 400 in such a way that a portion of the substrate 300 is not overlapped with the first insulation material 400 or the bonding layer 500 when viewed from a top view perspective. In some embodiments, the first insulation material 400 has a Young's modulus between about 0.1 GPa and about 50 GPa. In some embodiments, the first insulation material 400 has a Young's modulus between about 1 GPa and about 15 GPa. In some embodiments, a ratio of the substrate 300's Young's modulus to the first insulation material 400's Young's modulus is between about 3 and about 2000. In some embodiments, the first insulation material 400 has a coefficient of thermal expansion (CTE) between about $15 \times 10^{-6}/°$ C. and about $100 \times 10^{-6}/°$ C. In some embodiments, a ratio of the first insulation material 400's CTE to the substrate 300's CTE is between about 5 and about 35. In some embodiments, the first insulation material 400 comprises polymeric material such as resin, ABF resin or epoxy compound.

In some embodiments, a Young's modulus of the substrate 300 is higher than that of the first insulation material 400, such that the substrate 300 can provide better support to the semiconductor structure 1 than the first insulation material 400, thus reducing warpage. In some embodiments, a CIE of the substrate 300 is lower than that of the first insulation material 400, such that the substrate 300 exhibits less thermal extension during various processes than the first insulation material 400, thus keeping the shape of the semiconductor structure 1 stable and preventing warpage. In some embodiments, a CTE of the first die 100 and a CTE of the second die 200 are about the same as the CTE of the substrate 300. In some embodiments, a Young's modulus of the first die 100 and a Young's modulus of the second die 200 are about the same as the Young's modulus of the substrate 300.

In some embodiments, the first interconnect layer IN1 is disposed over the first insulation material 400. In some embodiments, the first interconnect layer IN1 is disposed over the first die 100 or the second die 200. In some embodiments, the first interconnect layer IN1 is disposed on the first insulation material 400, the first dielectric 130 or the second dielectric 230. In some embodiments, the first interconnect layer IN1 comprises several conductors D3 and a dielectric material E1 surrounding the conductors D3. In some embodiments, the conductors D3 are extended through the first interconnect layer IN1. In some embodiments, the conductors D3 are electrically connected to the first die 100 or the second die 200. In some embodiments, the conductors D3 are electrically connected to the first die 100 or the second die 200 through the conductors D1 or D2. In some embodiments, the first interconnect layer N1 is a redistribution layer (RDL).

In some embodiments, the electronic device 700 is disposed vertically over the first die 100 and the second die 200. In some embodiments, the electronic device 700 is at least partially overlapped with the insulation material 400 between the first die 100 and the second die 200 from a top view perspective. In some embodiments, the electronic device 700 is at least partially overlapped with the gap 430 between the first die 100 and the second die 200 as viewed from a top view perspective. In some embodiments, at least a portion of the electronic device 700 is overlapped with the insulation material 400 between the first die 100 and the second die 200, and is overlapped the substrate from a top view perspective. In some embodiments, at least a portion of the electronic device 700 is overlapped with the gap 430 and the substrate 300. In some embodiments, the electronic device 700 is disposed on the first interconnect layer IN1. In some embodiments, the electronic device 700 is electrically connected to the conductor D1 and/or the conductor D2. In some embodiments, the electronic device 700 is electrically connected to the conductor D1 and/or the conductor D2 by the conductor D3 and/or at least one microbump 720 disposed through the first interconnect layer IN1. In some embodiments, the microbump 720 comprises solder or ENEPIG. In some embodiments, the electronic device 700 is electrically connected to the first die 100 and/or the second die 200. In some embodiments, the electronic device 700 is electrically connected to the first die 100 and/or the second die 200 by the microbump 720, the conductor D3, the conductor D1 and/or the conductor D2. In some embodiments, the electronic device 700 is configured to electrically bridge the first die 100 and the second die 200 with a circuit pattern (not shown) disposed thereon by semiconductor processes. In some embodiments, the substrate 300 is configured to support the semiconductor structure 1 and reduce warpage, thus preventing a crack that might occur in the gap 430 between the first die 100 and the second die 200 and that might damage the electronic device 700.

In some embodiments, a ratio of a long side to a short side of the electronic device 700 is about 1 to 4. In some embodiments, a ratio of a long side to a short side of the electronic device 700 is about 1 to 2. In some embodiments, a ratio of a long side to a short side of the electronic device 700 is about 1.1, In some embodiments, the electronic device 700 has a die size of about 15×16 mm$^2$.

In some embodiments, the electronic device 700 is a device that includes semiconductive materials such as silicon and is fabricated with a predetermined functional circuit within the electronic device 700 produced by photolithography or any suitable operations. In some embodiments, the electronic device 700 is singulated from a silicon wafer by a mechanical blade or a laser blade. In some embodiments, the electronic device 700 is a chip, a passive device, an active device, a line conductor, a microstrip structure or the like. In some embodiments, the electronic device 700 comprises a variety of electrical circuits suitable for a particular application. In some embodiments, the electrical circuits include various devices such as transistors, capacitors, resistors, diodes and/or the like. In some embodiments, the electronic device 700 includes capacitors, resistors, inductors or the like. In some embodiments, the electronic device 700 is an integrated passive device (IPD). In some embodiments, the electronic device 700 is a logic device, graphics processing unit (GPU), application processing (AP) device, memory device, dynamic random access memory (DRAM) device, static random access memory (SRAM) device, high bandwidth memory (IBM) device, or the like. In some embodiments, the electronic device 700 has a top-view cross section (i.e., a cross section of the semiconductor structure 1 as viewed from a top view perspective) having a quadrilateral, a rectangular or a square shape.

In some embodiments, the second insulation material 800 is disposed over the first interconnect layer IN1. In some embodiments, the second insulation material 800 is disposed on a surface of the first interconnect layer IN1, wherein the surface of the first interconnect layer IN1 faces away from the substrate 300. In some embodiments, the second insulation material 800 is disposed over the electronic device 700. In some embodiments, a surface of the second insulation material 800 facing away from the substrate 300 is coplanar with a surface of the electronic device 700 facing away from the substrate 300, In some embodiments, a portion of the second insulation material 800 is under the electronic device 700. In some embodiments, a surface of the second insulation material 800 facing toward the substrate 300 is coplanar with a surface of the electronic device 700 facing toward the substrate 300. In some embodiments, a lateral sidewall of the electronic device 700 is exposed through the second insulation material 800. In some embodiments, the second insulation material 800 surrounds the electronic device 700. In some embodiments, the electronic device 700 is embedded in or sealed by the second insulation material 800. In some embodiments, the second insulation material 800 comprises polymeric material such as resin, ABF resin or epoxy compound.

In some embodiments, several conductors D4 are disposed in the second insulation material 800. In some embodiments, the conductors D4 extend through the second insulation material 800. In some embodiments, the conductors D4 are disposed under the electronic device 700. In some embodiments, the conductor D4 is disposed on the microbump 720. In some embodiments, the conductors D4 are electrically connected to the conductors D3 in the first interconnect layer IN1. In some embodiments, the conductor D4 is electrically connected to the electronic device 700 and/or the microbump 720. In some embodiments, the conductor D4 has a cylindrical, hemispherical or spherical shape.

In some embodiments, the second interconnect layer IN2 is disposed over the second insulation material 800, In some embodiments, the second interconnect layer IN2 is disposed over the electronic device 700. In some embodiments, the second interconnect layer IN2 is disposed on the second insulation material 800 and/or the electronic device 700. In some embodiments, the second interconnect layer IN2 surrounds a portion of the electronic device 700. In some embodiments, a portion of the electronic device 700 extends from the second insulation material 800 into the second interconnect layer IN2. In some embodiments, a portion of the electronic device 700 is embedded in or sealed by the second interconnect layer IN2. In some embodiments, the second interconnect layer IN2 comprises several conductors D5 and a dielectric material E2 surrounding the conductors D5. In some embodiments, the conductors D5 extend into the second interconnect layer IN2 vertically, laterally, or in any suitable direction according to the application. In some embodiments, the conductors D5 extend through the second interconnect layer IN2. In some embodiments, the conductors D5 are electrically connected to the conductors D4. In some embodiments, the conductors D5 are electrically connected to the electronic device 700. In some embodiments, the second interconnect layer IN2 is a redistribution layer (RDL).

In some embodiments, the conductive bumps 600 are disposed on the second interconnect layer IN2. In some embodiments, the conductive bumps 600 are electrically connected to the conductors D5. In some embodiments, the conductive bump 600 comprises solder or ENEPIG. In some embodiments, the conductive bump 600 is a controlled collapse chip connection (C4) hump. In some embodiments, the semiconductor structure 1 includes several conductive pads 650 between the conductors D5 and the conductive bumps 600. In some embodiments, the conductive pads 650 electrically connect the conductive bumps 600 to the conductors D5.

Figure 5:
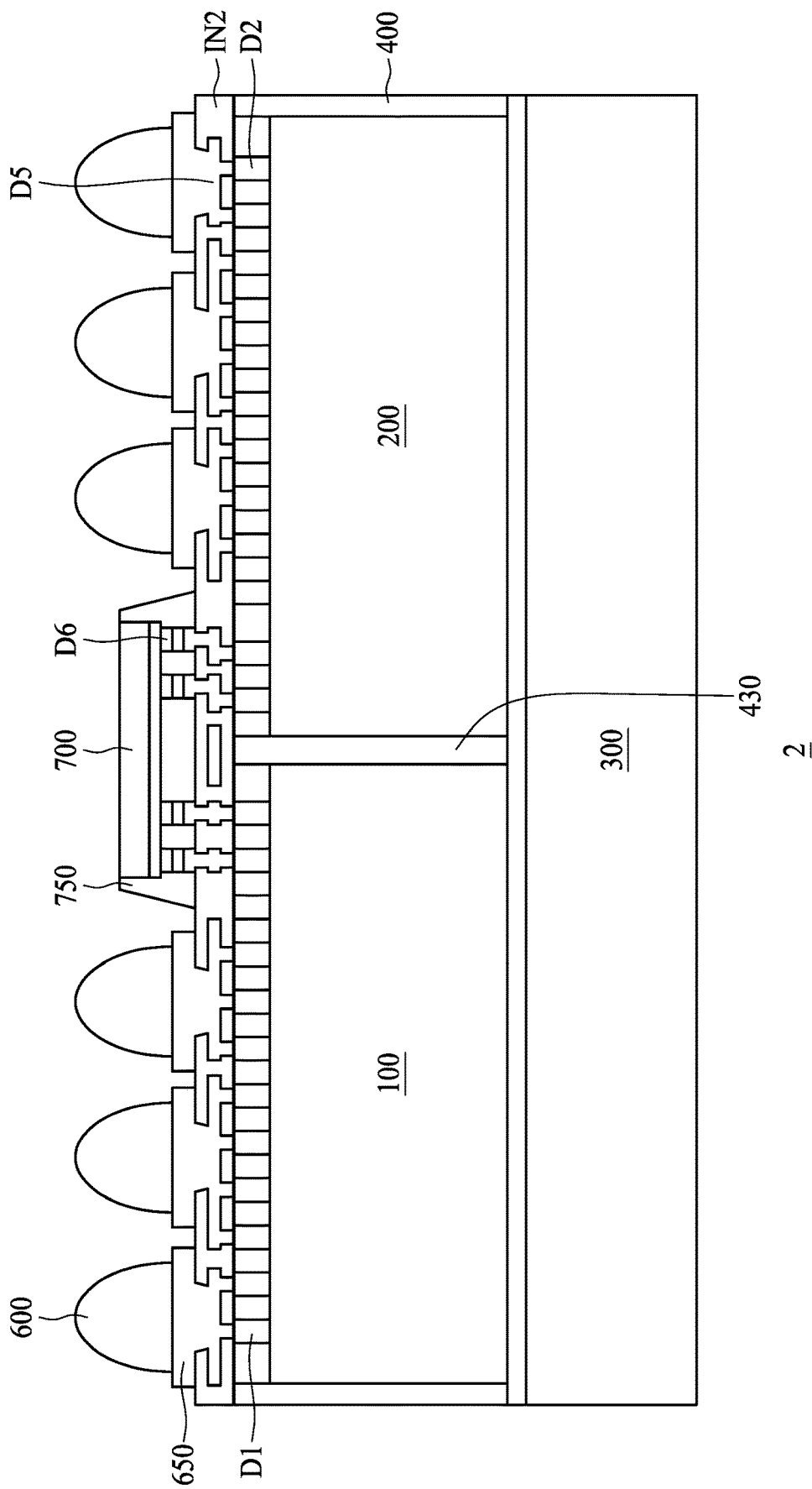
FIG. 5 is a cross-sectional view a semiconductor structure in accordance with some embodiments of the present disclosure.

FIG. 5 is a cross-sectional view of a semiconductor structure 2 in accordance with some embodiments of the present disclosure. Identical numeral annotations represent identical or similar elements and, for the purpose of brevity, are not repeated herein. A difference between the semiconductor structure 2 and the examples of the semiconductor structure 1 in FIGS. 1 to 4 is that the electronic device 700 of the semiconductor structure 2 is mounted on the second interconnect layer IN2. In some embodiments, the electronic device 700 is laterally surrounded by the conductive bumps 600. In some embodiments, the electronic device 700 is vertically lower than the conductive bumps 600. In some embodiments, the electronic device 700 is at least partially overlapped with the gap 430 between the first die 100 and the second die 200 from a top view perspective. In some embodiments, at least a portion of the electronic device 700 is overlapped with the gap 430 and the substrate 300.

As shown in FIG. 5, in some embodiments, a third insulation material 750 is disposed around the electronic device 700. In some embodiments, the third insulation material 750 vertically covers the electronic device 700. In some embodiments, the third insulation material 750 is laterally surrounded by the conductive bumps 600. In some embodiments, the third insulation material 750 exposes a surface of the electronic device 700, wherein the surface of the electronic device 700 faces away from the substrate 300. In some embodiments, the electronic device 700 is embedded in or sealed by the third insulation material 750. In some embodiments, several conductors D6 are disposed in the third insulation material 750 to electrically connect the electronic device 700 and the conductors D5. In some embodiments, the electronic device 700 is electrically connected to the first die 100 and the second die 200 by the conductors D6, the conductors D5, the conductors D1, and the conductors D2.

Figure 6:
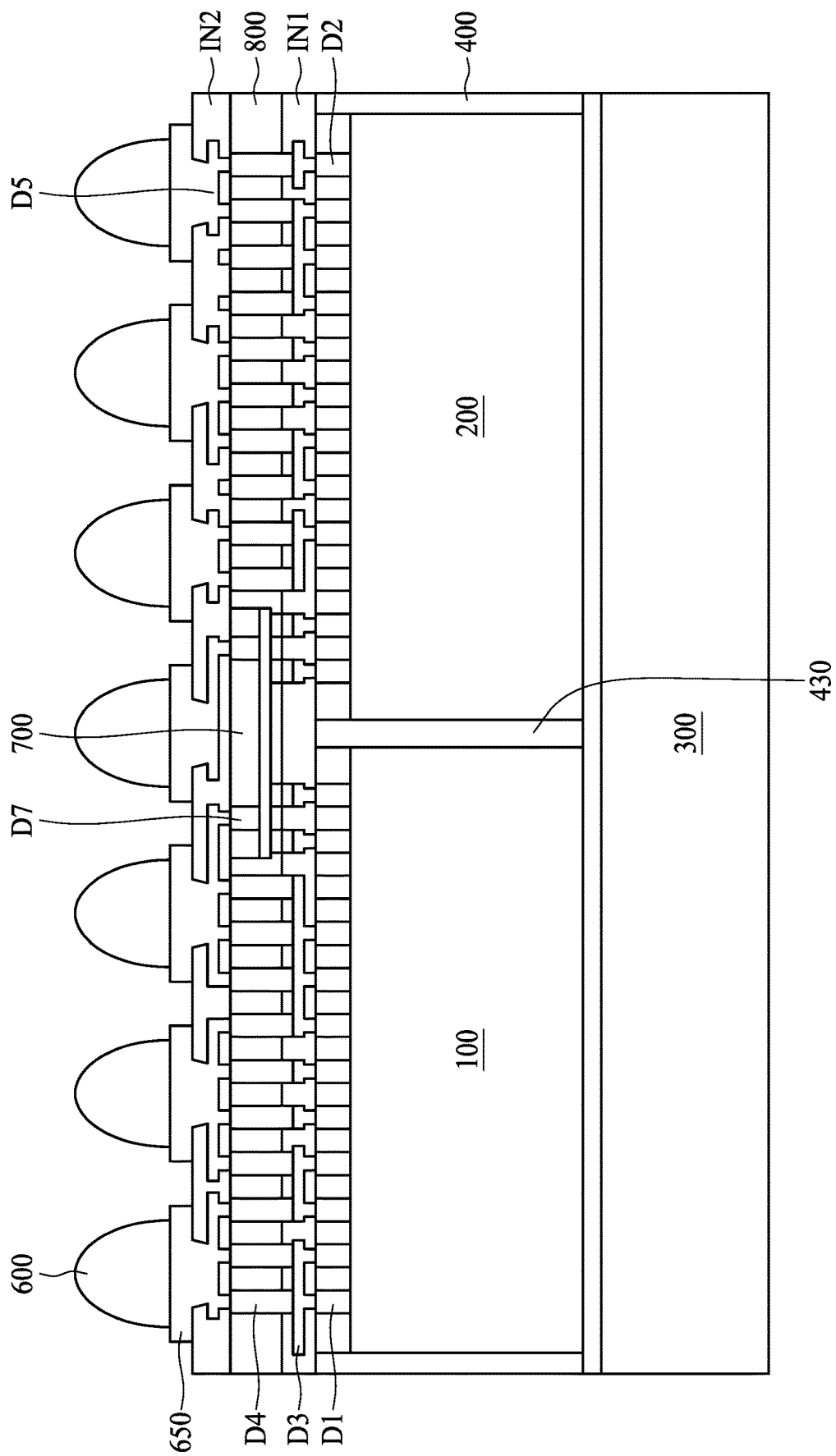
FIG. 6 is a cross-sectional view of a semiconductor structure in accordance with some embodiments of the present disclosure.

FIG. 6 is a cross-sectional view of a semiconductor structure 3 in accordance with some embodiments of the present disclosure, Identical numeral annotations represent identical or similar elements and, for the purpose of brevity, are not repeated herein. A difference between the semiconductor structure 3 and the examples of the semiconductor structure 1 in FIGS. 1 to 4 is that, in the semiconductor 3, several seventh conductors D7 are disposed in the electronic device 700. In some embodiments, the conductors D7 extend through the electronic device 700. In some embodiments, the conductors D7 electrically connect the electronic device 700 to the conductors D5.

Figure 7:
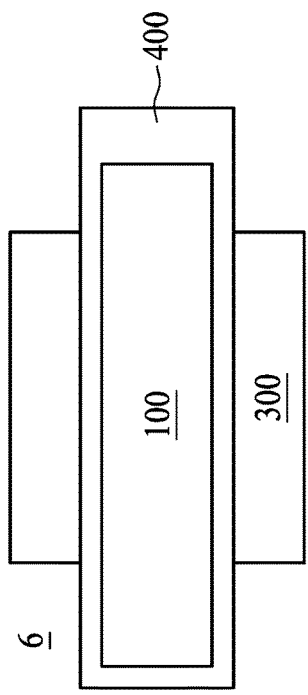
FIG. 7 is a top view of a semiconductor structure in accordance with some embodiments of the present disclosure.
Figure 9:
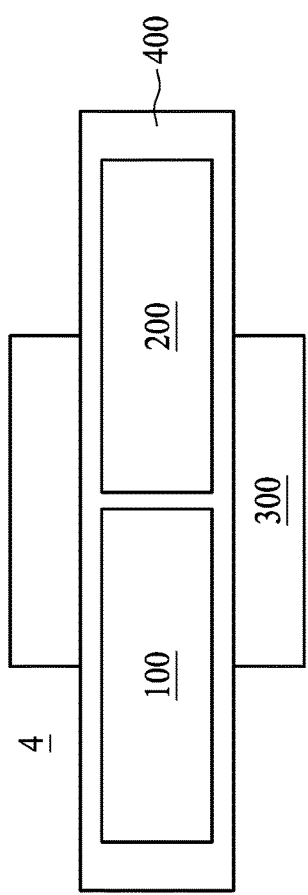
FIG. 9 is a top view of a semiconductor structure in accordance with some embodiments of the present disclosure.
Figure 8:
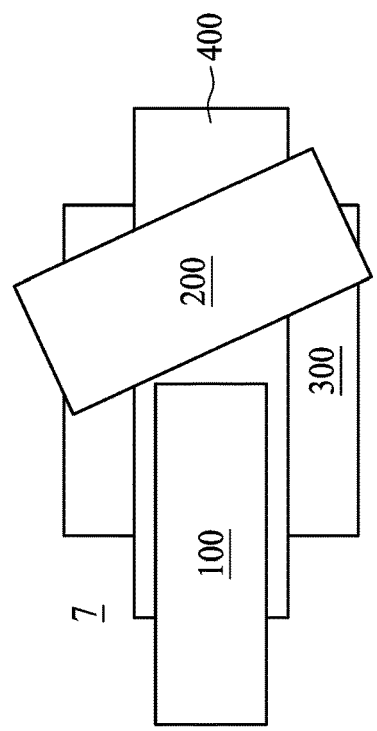
FIG. 8 is a top view of a semiconductor structure in accordance with some embodiments of the present disclosure.
Figure 10:
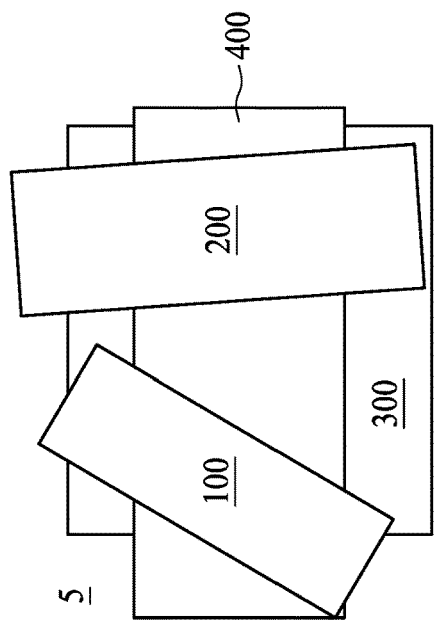
FIG. 10 is a top view of a semiconductor structure in accordance with some embodiments of the present disclosure.

FIG. 7 is a top view of a semiconductor structure 4 in accordance with some embodiments of the present disclosure. FIG. 8 is a top view of a semiconductor structure 5 in accordance with some embodiments of the present disclosure. FIG. 9 is a top view of a semiconductor structure 6 in accordance with some embodiments of the present disclosure. FIG. 10 is a top view of a semiconductor structure 7 in accordance with some embodiments of the present disclosure. Identical numeral annotations represent identical or similar elements and, for the purpose of brevity, are not repeated herein. In some embodiments, one or more dies (100 and/or 200) are disposed vertically over the substrate 300 and laterally arranged. In some embodiments, the first die 100 is adjacent to the second die 200. In some embodiments, a portion of the first die 100 is in contact with a portion of the second die 200. In some embodiments, the first die 100 or the second die 200 is nonsquare when viewed from a top view perspective. In some embodiments, an outline of a combination of the first die 100 and the second die 200 is nonsquare when viewed from a top view perspective. In some embodiments, a short side of the first die 100 faces a short side of the second die 200. In some embodiments, a short side of the first die 100 faces a long side of the second die 200. In some embodiments, a long side of the first die 100 faces a long side of the second die 200. In some embodiments, each of the first die 100 and the second die 200 is at least partially overlapped with the substrate 300 when viewed from a top view perspective. In some embodiments, a ratio of a long side to a short side of the first die TOO or the second die 200 is about 1 to 4. In some embodiments, a ratio of a long side to a short side of the first die 100 or the second die 200 is about 1.5 to 2. In some embodiments, a ratio of a long side to a short side of the first die 100 or the second die 200 is about 1.7. In some embodiments, the first die 100 or the second die 200 has a die size of about 15×25.5 mm².

In some embodiments, an insulation material 400 surrounds an area between the first die 100 and the second die 200. In some embodiments, the insulation material 400 is between the first die 100 and the second die 200. In some embodiments, the insulation material 400, a portion of the first die 100 adjacent to the insulation material 400, and a portion of the second die 200 adjacent to the insulation material 400 are overlapped with the substrate 300 when viewed from a top view perspective.

Some embodiments of the present disclosure provide a method of forming a semiconductor package device. The method includes: providing a substrate; bonding a first die to an upper surface of the substrate through a bonding layer; bonding a second die to the upper surface of the substrate through the bonding layer, the second die laterally separated from the first die; depositing an insulation material between the first die and the second die and filling a gap measured between sidewalk of the first die and the second die; forming a first interconnect layer over the first die and the second die to form the semiconductor package device; and performing a testing operation on semiconductor package device with the substrate in place. A Young's modulus of the substrate is greater than that of the insulation material.

Some embodiments of the present disclosure provide a method of forming a semiconductor structure. The method includes: receiving a substrate consisting essentially of bulk silicon; disposing a bonding layer over the substrate; bonding a first die to the substrate through the bonding layer; bonding a second die to the substrate through the bonding layer, the second die spaced apart from the first die by a gap; forming an interconnect layer over the first die and the second die; depositing an insulation material filling the gap; and performing a testing operation on the semiconductor structure while keeping the substrate bonded to the first die and the second die. The substrate is overlapped with the gap from a top view perspective.

Some embodiments of the present disclosure provide a method of forming a semiconductor package. The method includes: providing a first substrate consisting essentially of silicon; bonding a first die and a second die to the first substrate through a bonding layer, the first die and the second die are separated by a gap; filling the gap with an insulation material; forming a first interconnect layer disposed over insulation material; forming a conductive bump over the first interconnect layer; bonding the conductive bump to a second substrate to form the semiconductor package; and performing a testing operation on the semiconductor package. The first substrate is partially overlapped with the gap from a top view perspective, wherein the first substrate is distant from the gap by a thickness of the bonding layer, and a Young's modulus of the substrate is greater than that of the insulation material.

The foregoing outlines features of several embodiments so that those skilled in the art may better understand the aspects of the present disclosure. Those skilled in the art should appreciate that they may readily use the present disclosure as a basis for designing or modifying other operations and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions; and alterations herein without departing from the spirit and scope of the present disclosure.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method of forming a semiconductor package device, comprising:
   providing a carrier substrate;
   bonding a first die to an upper surface of the carrier substrate through a die attach film, wherein the carrier substrate and the die attach film are free from any electrical element;
   bonding a second die to the upper surface of the carrier substrate through the die attach film, the second die laterally separated from the first die, wherein the die attach film is formed of a same material and is in physical contact with an entire backside of the first die and an entire backside the second die;
   depositing a first insulation material between the first die and the second die and filling a gap measured between sidewalls of the first die and the second die, wherein the first insulation material is free from any electrical element;
   forming a plurality of first conductors over the first die and the second die;
   forming a first interconnect layer over the plurality of first conductors;
   disposing a first dielectric layer to laterally surround the plurality of first conductors;
   disposing an electronic device over the first interconnect layer, the electronic device comprising conductive vias extending through a device substrate of the electronic device;
   forming a plurality of second conductors over the first interconnect layer and adjacent to the electronic device;
   depositing a second insulation material to encapsulate the electronic device and the plurality of second conductors;
   forming a second interconnect layer over the plurality of second conductors, the second interconnect layer covering an entirety of the electronic device and electrically connected to the conductive vias; and
   depositing a plurality of conductive pads over the second interconnect layer, wherein a sidewall of each of the plurality of conductive pads is exposed through the second interconnect layer.

2. The method of claim 1, wherein the electronic device is at least partially overlapped with the first insulation material from a top view perspective.

3. The method of claim 1, wherein the electronic device has an upper planar surface level with an upper planar surface of each of the plurality of second conductors.

4. The method of claim 1, wherein the first insulation material has a planar upper surface level with a planar upper surface of each of the plurality of first conductors.

5. The method of claim 1, further comprising:
   a first microbump extending between and electrically connecting the first die and the electronic device; and
   a second microbump extending between and electrically connecting the second die and the electronic device.

6. The method of claim 5, wherein the first microbump and the second microbump are disposed directly below the electronic device.

7. The method of claim 1, wherein the first insulation material further laterally surrounds the first die and the second die.

8. The method of claim 1, wherein the second insulation material is coplanar with an upper surface of the electronic device.

9. The method of claim 1, further comprising forming conductive bumps over the plurality of conductive pads.

10. The method of claim 9, further comprising mounting the semiconductor package device to another semiconductor device through the conductive bumps.

11. The method of claim 1, wherein a longitudinal axis of the first die is non-parallel to a longitudinal axis of the second die from a top-view perspective.

12. The method of claim 1, wherein opposite sidewalls of the die attach film are aligned with respective opposite sidewalls of the carrier substrate.

13. A method of forming a semiconductor structure, comprising:
   receiving a substrate;
   disposing a bonding layer over the substrate, wherein the substrate and the bonding layer are free from any electrical element;
   bonding a first die to the substrate through the bonding layer;
   bonding a second die to the substrate through the bonding layer, the second die spaced apart from the first die by a gap, wherein the bonding layer is vertically overlapped with the first die and the second die, and comprises a surface extending continuously from the first die to the second die, wherein the bonding layer is formed of a same material and is in physical contact with an entire backside of the first die and an entire backside the second die;
   forming a plurality of first conductors over the first die and the second die;
   forming a first interconnect layer over the plurality of first conductors;

depositing a first insulation material filling the gap, wherein the first insulation material is free from any electrical element;

disposing a first dielectric layer horizontally adjacent to the first insulation material, the first dielectric layer laterally surrounding the plurality of first conductors, wherein an interface is formed on a substantially straight sidewall of the gap from a first level at an upper surface of the first conductors to a second level at an upper surface of the first die;

disposing an electronic device over the first interconnect layer;

forming a plurality of second conductors over the first interconnect layer and adjacent to the electronic device;

depositing a second insulation material to encapsulate the electronic device and the plurality of second conductors;

forming a second interconnect layer over the plurality of second conductors, the second interconnect layer covering an entirety of the electronic device; and depositing a plurality of conductive pads over the second interconnect layer, wherein a sidewall of each of the plurality of conductive pads is exposed through the second interconnect layer, wherein the substrate is overlapped with the gap from a top view perspective.

14. The method of claim 13, wherein the plurality of second conductors are respectively vertically aligned with the plurality of first conductors.

15. The method of claim 13, wherein the depositing of the first insulation material causes the first insulation material to laterally surround the first die and the second die.

16. The method of claim 13, wherein the depositing of the first insulation material causes the first insulation material to laterally surround the substrate.

17. The method of claim 13, wherein the first insulation material has a top surface level with an upper surface of the first conductors, wherein an interface is formed at a boundary between the top surface of the first insulation material and the first interconnect layer.

18. A method of forming a semiconductor package, comprising:

providing a first substrate;

bonding a first die and a second die to the first substrate through a silicon oxide layer, wherein the first substrate and the silicon oxide layer are free from any electrical element, wherein the first die and the second die are separated by a gap, and the silicon oxide layer comprises a thickness that is substantially uniform across an entirety of each of the first die and the second die, wherein the silicon oxide layer is formed of a same material and is in physical contact with an entire backside of the first die and an entire backside the second die;

forming a plurality of first conductors over the first die and the second die;

filling the gap with a first insulation material, wherein the first insulation material is free from any electrical element;

forming a first interconnect layer disposed over the first insulation material;

disposing a first dielectric layer horizontally adjacent to the first insulation material, the first dielectric layer laterally surrounding the plurality of first conductors;

disposing an electronic device over the first interconnect layer, the electronic device comprising conductive vias extending through a device substrate of the electronic device;

forming a plurality of second conductors over the first interconnect layer and adjacent to the electronic device;

depositing a second insulation material to encapsulate the electronic device and the plurality of second conductors; and forming a second interconnect layer over the plurality of second conductors, the second interconnect layer covering an entirety of the electronic device and electrically connected to the conductive vias; and depositing a plurality of conductive pads over the second interconnect layer, wherein a sidewall of each of the plurality of conductive pads is exposed through the second interconnect layer.

19. The method of claim 18, wherein the bonding silicon oxide layer covers an entirety of the first insulation material between the first die and the second die.

20. The method of claim 18, wherein the first insulation material further laterally surrounds the first and second dies.

* * * * *